(12) United States Patent
Hirano

(10) Patent No.: US 6,586,319 B1
(45) Date of Patent: Jul. 1, 2003

(54) HIGH-SPEED COMPOUND SEMICONDUCTOR DEVICE HAVING A MINIMIZED PARASITIC CAPACITANCE AND RESISTANCE

(75) Inventor: Hidenori Hirano, Yamanashi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/307,733

(22) Filed: May 10, 1999

Related U.S. Application Data

(62) Division of application No. 08/902,019, filed on Jul. 29, 1997, now Pat. No. 5,939,737.

(30) Foreign Application Priority Data

Jan. 7, 1997 (JP) .............................................. 9-000972

(51) Int. Cl.[7] .......................... H01L 21/28; H01L 21/44
(52) U.S. Cl. ...................... 438/574; 438/167; 438/182; 257/194
(58) Field of Search ................................. 257/194, 201, 257/192; 438/574, 572, 579, 167, 172, 182

(56) References Cited

U.S. PATENT DOCUMENTS

| | | | |
|---|---|---|---|
| 4,916,498 A | | 4/1990 | Berenz |
| 5,300,445 A | * | 4/1994 | Oku .......................... 437/40 |
| 5,496,758 A | * | 3/1996 | Ema .......................... 437/52 |
| 5,677,553 A | | 10/1997 | Yamamoto et al. |
| 5,693,548 A | * | 12/1997 | Lee et al. ...................... 437/41 |
| 5,693,560 A | * | 12/1997 | Hattori et al. ............... 437/184 |
| 5,766,967 A | * | 6/1998 | Lai et al. ..................... 437/415 |
| 5,811,844 A | | 9/1998 | Kuo et al. |
| 5,818,078 A | * | 10/1998 | Makiyama et al. .......... 257/281 |
| 5,837,589 A | * | 11/1998 | McNamara et al. ......... 438/314 |
| 5,888,860 A | * | 3/1999 | Kohno ........................ 438/180 |
| 6,121,153 A | * | 9/2000 | Kikkawa ..................... 438/706 |

FOREIGN PATENT DOCUMENTS

| | | |
|---|---|---|
| EP | 0 240 307 | 10/1987 |
| EP | 0 715 346 | 11/1994 |
| EP | 0 684 633 | 11/1995 |
| FR | 2 639 762 | 6/1990 |
| JP | 6-45368 | 2/1994 |
| JP | 6-196504 | 7/1994 |
| JP | 7-86574 | 3/1995 |

OTHER PUBLICATIONS

Kuroda et al. "0.25 mu m gate length N–InGaP/InGaAs/GaAs HEMT DCFL circuit with lower power dissipation than high–speed Si CMOS circuits"; pp. 323–326; Electron Devices Meeting, 1992. Technical Digest Dec. 13–16, 1992.*

Ohara S et al: "InGaP/GaAs Power HBTS With a Low Bias Voltage" Technical Digest of the International Electron Devices Meeting (IDEM), Washington, Dec. 10–13, 1995, Dec. 10, 1995, Institute of Electrical and Electronic Engineers, pp. 791–794.

(List continued on next page.)

Primary Examiner—Olik Chaudhuri
Assistant Examiner—Fernando Toledo
(74) Attorney, Agent, or Firm—Armstrong, Westerman & Hattori, LLP

(57) ABSTRACT

A method of fabricating a semiconductor device includes the steps of forming an insulation film on a compound semiconductor layer, forming an opening in the insulation film so as to expose a part of the compound semiconductor layer, forming a gate electrode of a refractory metal compound on the insulation film such that the gate electrode contacts with the compound semiconductor layer at the contact hole, and removing the insulation film by a wet etching process, wherein the wet etching process is conducted by an etchant to which both of the gate electrode and the compound semiconductor layer show a resistance.

8 Claims, 9 Drawing Sheets

OTHER PUBLICATIONS

Takahashi et al: "High–Reliability InGaP/GaAa HBTS Fabricated by Self–Aligned Process" 1995 IEEE International Conference on Systems, Man and Cybernetics, Vancouver, Oct. 22–25, 1995, vol. 1, Oct. 22, 1995, Institute of Electrical and Electronics Engineers, pp. 191–194.

Ya–Min Lee J et al: "The Preparation, Characterization and Application of Plasma–Enhanced Chemically Vapour Deposited Silicon Nitride Films Deposited at Low Temperatures" Thin Solid Films, 203 (1991) 275–287.

* cited by examiner

US 6,586,319 B1

HIGH-SPEED COMPOUND SEMICONDUCTOR DEVICE HAVING A MINIMIZED PARASITIC CAPACITANCE AND RESISTANCE

This is a division of application Ser. No. 08/902,019, filed Jul. 29, 1997, now U.S. Pat. No. 5,939,737.

BACKGROUND OF THE INVENTION

The present invention generally relates to semiconductor devices and more particularly to a compound semiconductor device having a heterostructure and a fabrication process thereof.

Compound semiconductor devices are semiconductor devices constructed on a compound semiconductor material that has a characteristically small effective mass for the electrons, and are used extensively for microwave applications where a high-speed operation of the device is essential. In such compound semiconductor devices, it is possible to design the band structure as desired by using ternary or quarternary compound semiconductor materials.

Compound semiconductor devices include field effect transistors (FETs) and bipolar transistors similarly to Si devices, wherein the compound FETs include HEMTs (High Electron Mobility Transistor) and MESFETs (Metal-Semiconductor FET) as typical examples, while the typical example of a compound bipolar transistor is an HBT (Hetero Bipolar Transistor). In a HEMT, a two-dimensional electron gas associated with a heterojunction interface is used for the carriers and realizes a very high speed operation due to the substantially scatter-free transport of the carriers in the two-dimensional electron gas. In an HBT, on the other hand, a high speed operation and simultaneously a large current gain are realized by using a widegap compound semiconductor material for the emitter in combination with a very thin base layer formed of a compound semiconductor material of a narrow bandgap.

In such conventional compound semiconductor devices, various efforts are being made for increasing the operational speed thereof further. For example, efforts are being made for reducing the gate length as much as possible in FETs such as a HEMT or MESFET. In the case of an HBT, the emitter area is reduced as much as possible.

FIGS. 1A and 1B show a conventional process of fabricating a HEMT.

Referring to FIG. 1A, the HEMT is constructed on a substrate 1 of a semi-insulating GaAs on which a semi-insulating buffer layer 2 of GaAs is formed. On the buffer layer 2, a channel layer 3 of undoped GaAs is formed, and an electron supplying layer 4 of an n-type AlGaAs is formed on the channel layer 3. Further, the electron supplying layer 4 is covered by etching stoppers 5A and 5B both formed of a thin layer of n-type AlGaAs respectively in correspondence to source and drain regions of the HEMT, and cap layers 6A and 6B both of n+-type GaAs are provided on the etching stoppers 5A and 5B respectively.

It should be noted that the HEMT of FIG. 1A further includes a gate electrode 7 of a mushroom type on the electron supplying layer 4 between the source region and the drain region, wherein the gate electrode 7 has a reduced lateral size at a bottom part and an increased lateral size at a top part, and a contact layer 8 of a Ti/Au structure is provided on the gate electrode 7 in conformity with the gate electrode 7.

In the HEMT of such a construction, a deep potential well is formed in the channel layer 3 along an interface between the channel layer 3 and the electron supplying layer 4 as a result of the heterojunction between GaAs forming the channel layer 3 and AlGaAs forming the electron supplying layer 4 and a two-dimensional electron gas is formed in such a deep potential well as is well known in the art.

It should be noted that the gate electrode 7 is formed of WSi of low resistance and establishes a Schottky contact with the electron supplying layer 4. Thereby, the gate electrode 7 controls the transport of the carriers from the source region to the drain region along the two-dimensional gas. By forming the gate electrode 7 in such a mushroom shape, it is possible to reduce the gate length substantially at the bottom part of the gate electrode 7. Further, such a mushroom gate is advantageous for reducing the gate resistance by increasing the gate cross sectional area at the top part thereof, and the operational speed of the HEMT is increased further.

In the construction of the HEMT of FIG. 1A, it should be noted that the mushroom gate 7 is formed first by depositing an insulation film 9 such that the insulation film 9 covers the layered semiconductor body including the foregoing semiconductor layers 1–4, 5A, 5B, 6A and 6B, followed by a formation of a deep contact hole exposing the electron supplying layer 4 in the insulation film 9. After the formation of the deep contact hole, a WSi layer forming the gate electrode 7 and a Ti/Au structure forming the contact layer 8 are deposited consecutively so as to fill the contact hole.

In the HEMT formed as such, it should be noted that the insulation film 9 remains even after the gate electrode 7 and the contact layer 8 thereon are patterned properly. Thereby, there occurs a problem that the insulation film 9 forms a capacitance coupling between the gate electrode 7 and the cap layer 6A or 6B across the insulation film 9 as indicated schematically in FIG. 1A.

As the existence of the cap layer causes a decrease in the operational speed of the HEMT, it has been practiced to remove the insulation film 9 by a wet etching process as indicated in FIG. 1A by arrows. Generally, the insulation film 9 is formed of $SiO_2$ and the wet etching process is conducted by HF.

However, the compound forming the gate electrode 7 is not exactly WSi but a non-stoichiometric compound represented as $WSi_x$, and the wet etching process of the insulation film 9 tends to cause the problem that the gate electrode 7 itself is etched during the etching process as indicated in FIG. 1B. When such an etching occurs in the gate electrode 7, there is a substantial risk that the contact between the gate electrode 7 and the electron supplying layer 4 may be impaired.

Further, the wet etching process of the insulation film 9 acts also upon the exposed electron supplying layer 4, wherein such an etching of the electron supplying layer 4 causes an unwanted decrease in the thickness of the electron supplying layer 4 at both sides of the gate electrode 7. When the thickness of the electron supplying layer 4 is reduced as such, there is a substantial risk that the surface depletion region associated with the free surface of the electron supplying layer 4, comes closer to the channel layer 3 or penetrates thereinto. The surface depletion region thus formed tends to expel the two-dimensional electron gas at the both sides of the gate electrode and causes an undesired increase in the parasitic resistance of the HEMT. It should be noted that the foregoing increase of the parasitic resistance appears particularly conspicuously due to the decrease of the gate length of the gate electrode 7 as a result of the erosion. It should be noted that a similar problem occurs not only in a HEMT but also in other FETs such as a MESFET.

SUMMARY OF THE INVENTION

Accordingly, it is a general object of the present invention to provide a novel and useful compound semiconductor device wherein the foregoing problems are eliminated.

Another and more specific object of the present invention is to provide a fabrication process of a compound semiconductor device including a step of removing an insulation film underneath a gate electrode by a wet etching process, wherein the wet etching process is conducted without etching the gate electrode or a semiconductor layer provided underneath the insulation film in contact with the gate electrode.

Another object of the present invention is to provide a fabrication process of a compound semiconductor device including an etching process, wherein the problem of unwanted etching of a semiconductor layer that is exposed as a result of the etching process, is successfully eliminated.

Another object of the present invention is to provide a method of fabricating a semiconductor device, comprising the steps of:

forming an insulation film on a compound semiconductor layer;

forming an opening in said insulation film so as to expose a part of said compound semiconductor layer;

forming a gate electrode of a refractory metal compound on said insulation film such that said gate electrode contacts with said compound semiconductor layer at said contact hole; and removing said insulation film by a wet etching process;

said wet etching process being conducted by an etchant to which both of said gate electrode and said compound semiconductor layer show a resistance.

Another object of the present invention is to provide a fabrication process of an HBT including a collector layer of a compound semiconductor material, a base layer of a compound semiconductor material and formed on said collector layer, an emitter pattern formed on said base layer, said emitter pattern being formed of a compound semiconductor material having a larger bandgap as compared with said compound semiconductor material forming said base layer, and an emitter electrode of a refractory metal compound formed on said emitter pattern, said method comprising the step of:

reducing an area of said emitter pattern by a wet etching process while using said emitter electrode as a mask;

said wet etching process being conducted by an etchant to which both of said compound semiconductor material forming said base layer and said refractory metal compound forming said emitter electrode show a resistance.

Another object of the present invention is to provide a HEMT, comprising:

a channel layer;

an electron supplying layer provided on said channel layer;

a pair of cap layers provided on said electron supplying layer respectively in correspondence to a source region and a drain region, said pair of cap layers exposing a part of said electron supplying layer between said source region and said drain region; and a gate electrode of a refractory metal compound provided on said exposed part of said electron supplying layer, said gate electrode having a reduced lateral size in a gate length direction at a bottom part thereof and an increased lateral size in said gate length direction at a top part thereof;

said refractory metal compound being selected from a group consisting of WN, TiW, TiWN;

said electron supplying layer including, at least in a top part thereof, a layer of InGaP with a thickness of about 5 nm.

Another object of the present invention is to provide a MESFET, comprising:

a channel layer;

a pair of cap layers provided on said channel layer respectively in correspondence to a source region and a drain region, said pair of cap layers exposing a part of said channel layer between said source region and said drain region; and a gate electrode of a refractory metal compound provided on said exposed part of said channel layer, said gate electrode having a reduced lateral size in a gate length direction at a bottom part thereof and an increased lateral size in said gate length direction at a top part thereof;

said refractory metal compound being selected from a group consisting of WN, TiW, TiWN;

said channel layer including, at least in a top part thereof, a layer of InGaP with a thickness of about 5 nm.

Another object of the present invention is to provide a HBT, comprising:

a collector layer of a compound semiconductor material;

a base layer of a compound semiconductor material, provided on said collector layer;

an emitter pattern provided on said base layer, said emitter pattern comprising a compound semiconductor material having a larger bandgap as compared with said compound semiconductor material forming said base; and an emitter electrode provided on said emitter pattern;

said base layer including a layer of InGaP having a thickness of about 5 nm in a top part thereof.

According to the present invention, the problem of erosion of the gate electrode as well as the semiconductor layer contacting the gate electrode at the time of the wet etching is successfully eliminated, and a high-speed semiconductor device having a reduced gate length is obtained. Further, the present invention is not only effective for FETs such as HEMT or MESFET but also to bipolar transistors such as HBT.

Other objects and further features of the present invention will become apparent from the following detailed description when read in conjunction with the attached drawings.

DETAILED DESCRIPTION OF THE PREFERRED EMBODIMENT

Principle

Figure 2A:
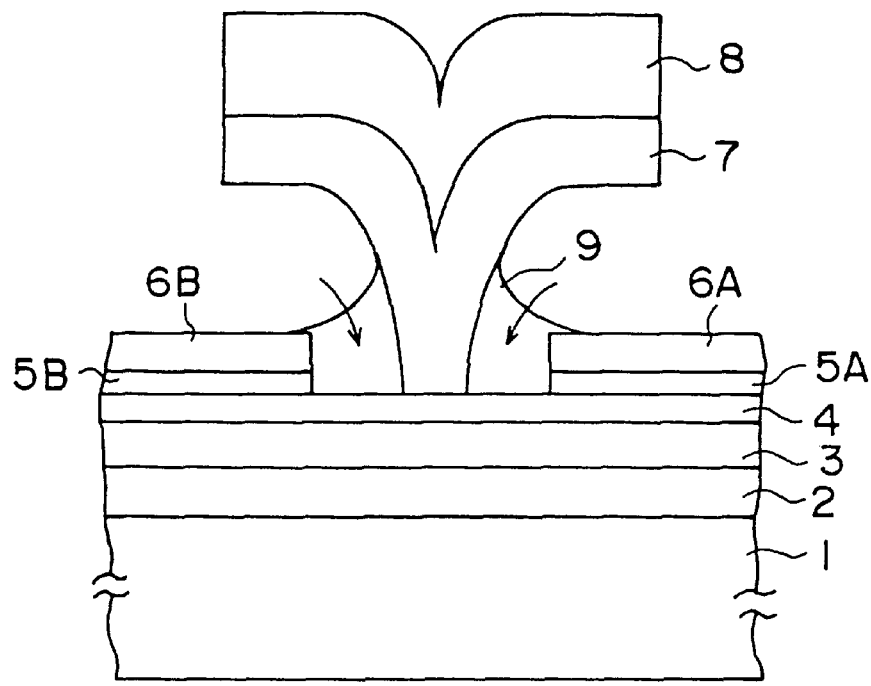
FIGS. 2A and 2B are diagrams showing the principle of the present invention.
Figure 2B:
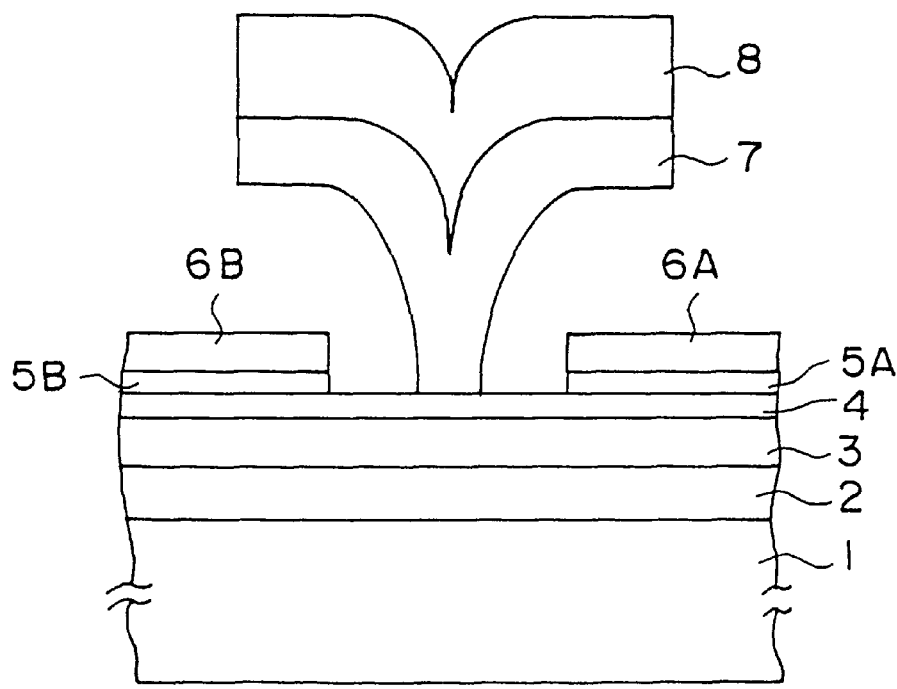

FIGS. 2A and 2B show the principle of the present invention, wherein those parts in FIGS. 2A and 2B corresponding to the parts described previously are designated by the same reference numerals and the description thereof will be omitted.

Figure 1A:
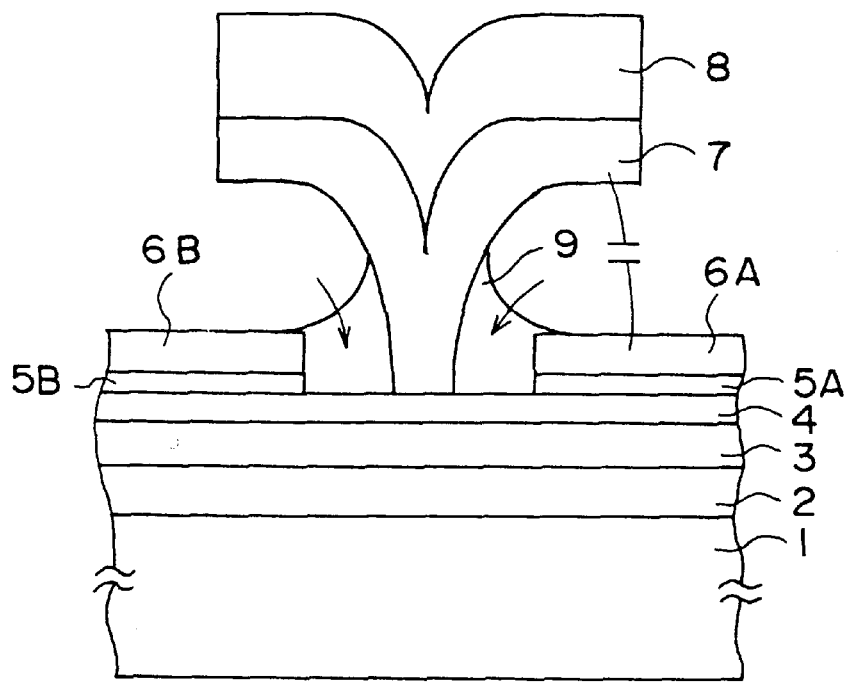
FIGS. 1A and 1B are diagrams showing a conventional fabrication process of a HEMT and a problem associated therewith.
Figure 1B:
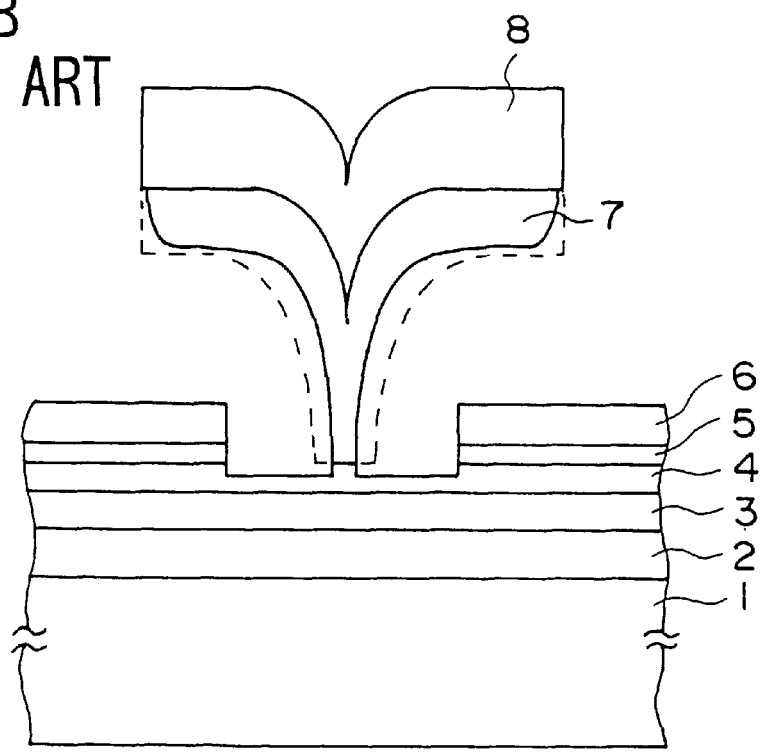

Referring to FIG. 2A, it should be noted that the present invention uses, for the gate electrode 7, a refractory metal compound not susceptible to erosion when removing the insulation film 9 by a wet etching process, such as TiW. Further, the present invention uses a compound semiconductor material not susceptible to the wet etching process, such as InGaP, for the electron supplying layer 4. Thereby, the problem of erosion of the electrode 7 or the electron supplying layer 4 during the wet etching process of the insulation film 9, as indicated in FIG. 1A, is successfully eliminated, and the gate electrode 7 or the electron supplying layer 4 in the structure thus obtained has a predetermined shape as indicated in FIG. 2B.

The foregoing process of the present invention is not only limited to a HEMT but is applicable also to the fabrication process of other FETs such as a MESFET. Further, the present invention is effective for reducing the emitter area in a bipolar transistor such as an HBT.

First Embodiment

FIGS. 3A–3H show the fabrication process of a HEMT 10 according to a first embodiment of the present invention.

Figure 3A:
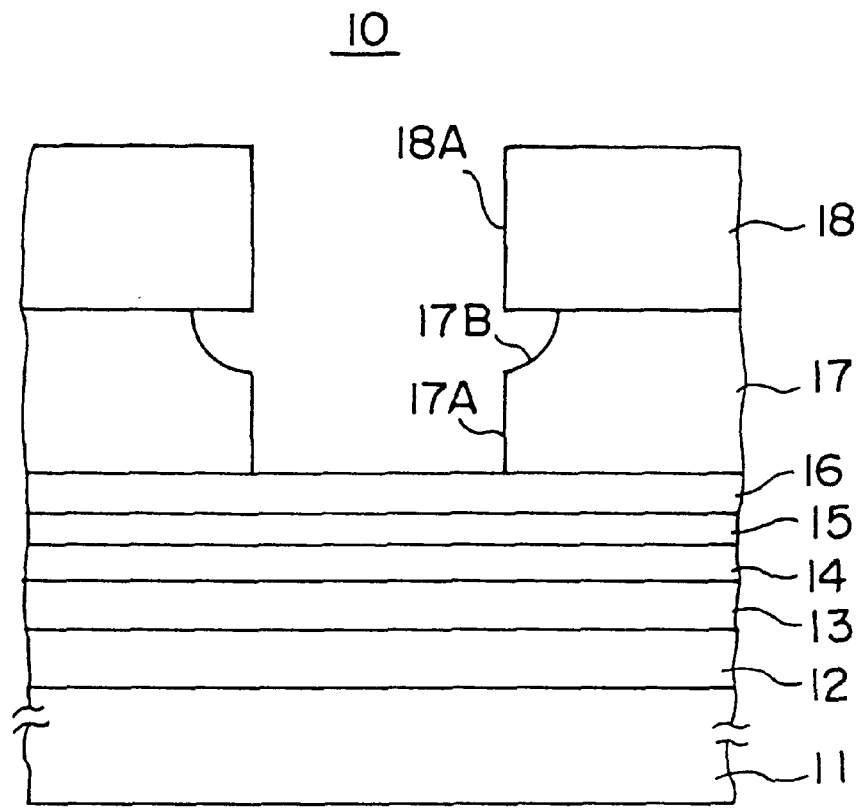
FIGS. 3A–3H are diagrams showing a fabrication process of a HEMT according to a first embodiment of the present invention.

Referring to FIG. 3A, the HEMT 10 is constructed on a substrate 11 of a semi-insulating GaAs carrying thereon an epitaxially grown buffer layer 12 of undoped GaAs. On the buffer layer 12, a channel layer 13 of undoped AlGaAs or InGaAs is provided epitaxially, and an electron supplying layer 14 of an n-type group III-V compound semiconductor material such as InGaP that contains P as the group V element, is provided further on the channel layer 13 epitaxially, and an etching stopper layer 15 of $n^+$-type AlGaAs and a cap layer 16 of $n^+$-type GaAs are deposited epitaxially on the electron supplying layer 14 to form a layered semiconductor body.

In the step of FIG. 3A, the layered semiconductor body thus formed is further covered by an insulation film 17 of $SiO_2$, followed by a deposition of a resist film 18 on the insulation film 17, and the resist film 18 thus deposited is patterned to form a resist pattern including an opening 18A such that the opening 18A exposes the foregoing cap layer 16 in correspondence to a gate region of the HEMT 10 to be formed.

After the formation of the foregoing opening 18A, the insulation film 17 is subjected to a wet etching process while using the resist film 18 as a mask, to form a depression 17B in the insulation film 17. It should be noted that the depression 17B is defined by a smooth curved surface.

After the foregoing depression 17B is thus formed, the insulation film 17 is further subjected to a dry etching process while using the resist film 18 again as a mask, to form an opening 17A inside the depression 17B such the opening 17A exposes the cap layer 16 as an extension of the depression 17B.

Figure 3B:
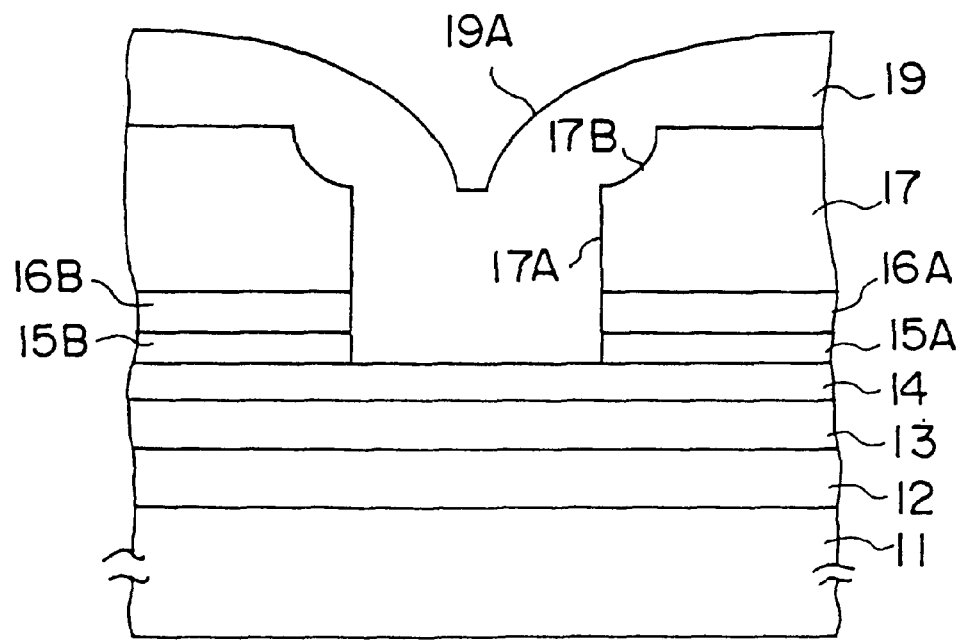

Next, in the step of FIG. 3B, a dry etching process is applied to the cap layer 16 via the foregoing opening 17A, to form separate cap regions 16A and 16B respectively corresponding to the source region and the drain region of the HEMT 10. It should be noted that the dry etching process for forming the cap regions 16A and 16B stops spontaneously upon the exposure of the etching stopper layer 15, while the dry etching process is continued further with a different etching condition to pattern the etching stopper layer 15 into regions 15A and 15B respectively corresponding to the regions 16A and 16B. As a result of the etching thus conducted, the electron supplying layer 14 is exposed in correspondence to a gate region of the HEMT 10 to be formed.

After the patterning of the regions 15A and 16A as well as the regions 15B and 16B described above, the resist film 18 is removed and another insulation film 19 of $SiO_2$ is deposited on the structure thus obtained typically by a CVD process. The insulation film 19 thus formed shows a depression 19A defined by a smooth curved surface in correspondence to the foregoing opening 17A and the depression 17B.

Figure 3C:
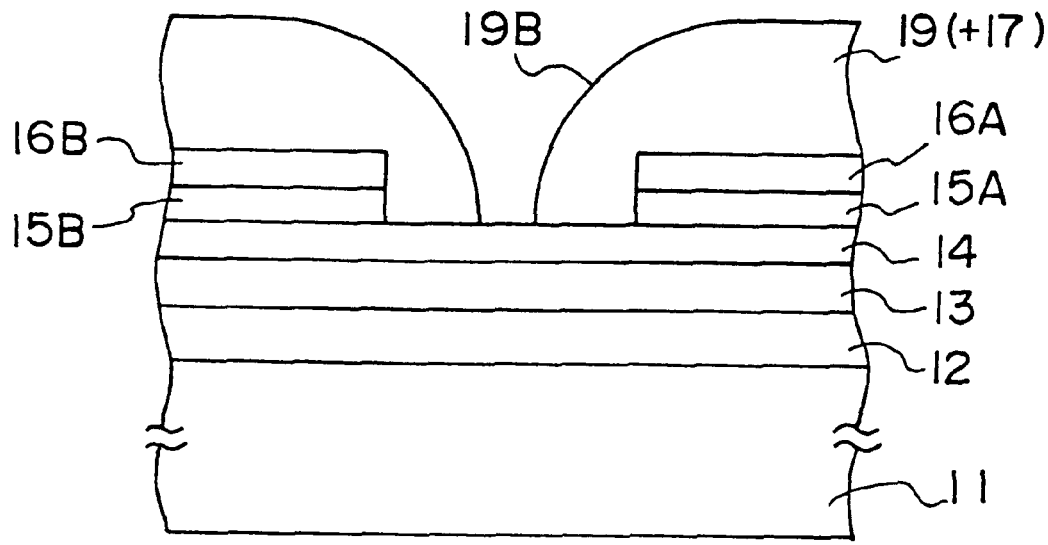

Next, in the step of FIG. 3C, a dry etching process is applied to the structure of FIG. 3B such that the dry etching process acts substantially vertically to the principal surface of the substrate 11. As a result of the dry etching process, a deep opening 19B is formed in the insulation film 19 in correspondence to the foregoing depression 19A, such that the opening 19B exposes the electron supplying layer 14. It should be noted that the opening 19B is defined by a smooth curved surface similar to the depression surface of FIG. 3C and has a lateral size that decreases continuously from the top surface to the bottom surface of the insulation film 19. In the illustration of FIG. 3C, it should be noted that the insulation film 19 includes the insulation film 17 as a part thereof.

Figure 3D:
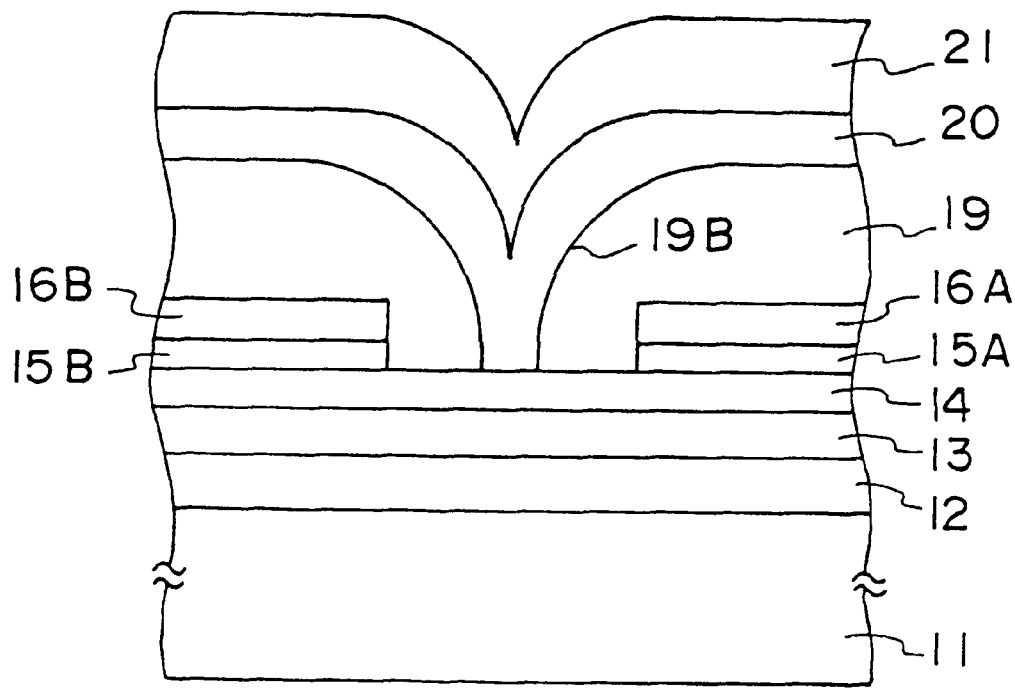

Next, in the step of FIG. 3D, an electrode film 20 of a refractory metal compound such as TiW, TiN or TiWN is deposited on the insulation film 19 by a sputtering process, and a low resistance layer 21 is formed further on the electrode film 20 by depositing a Ti film and an Au film consecutively on the electrode film 20 by an evaporation deposition process, wherein the deposition of the Ti film may be omitted if possible or appropriate. It should be noted that the electrode film 20 thus formed establishes a Schottky contact with the exposed surface of the electron supplying layer 14.

Figure 3E:
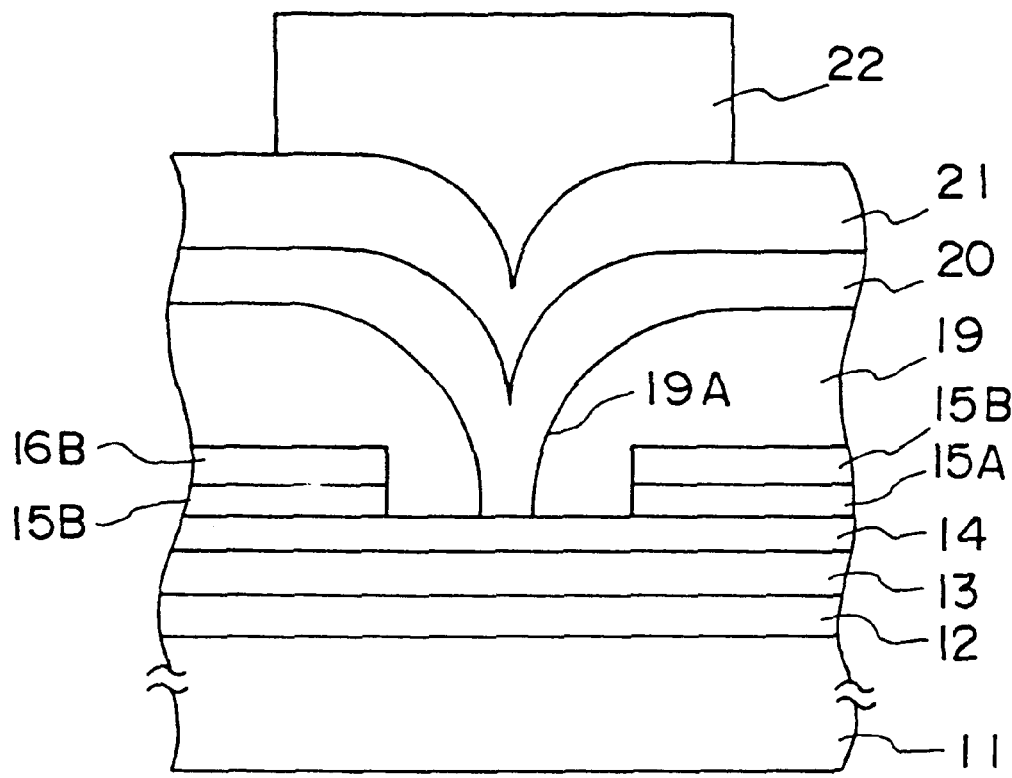
Figure 3F:
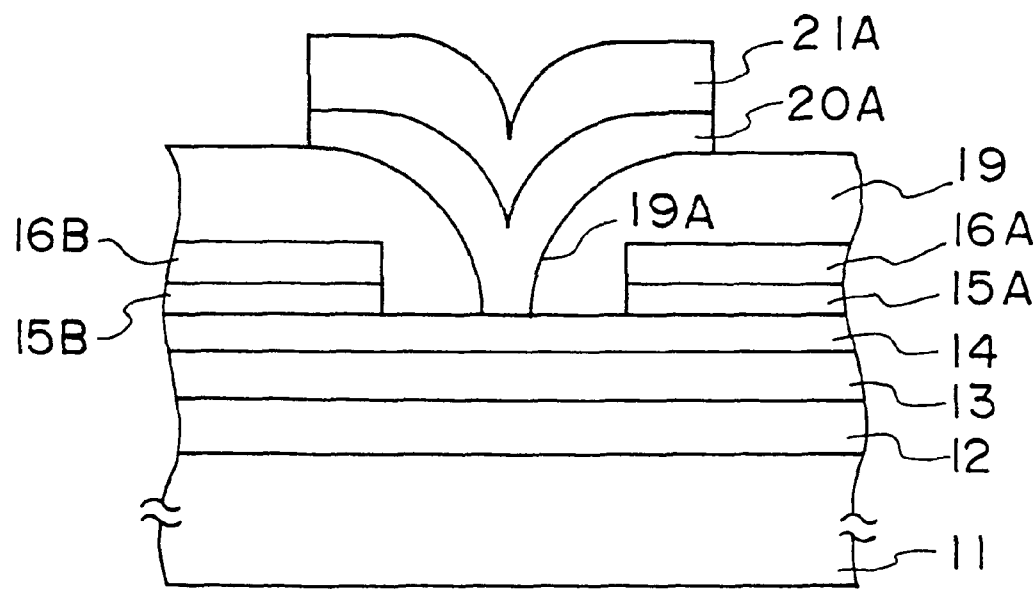

Next, in the step of FIG. 3E, a resist pattern 22 is formed on the low resistance layer 21 in correspondence to the gate region, and an electrode pattern 20A is formed by patterning the low resistance layer 21 and the electrode film 20 underneath consecutively while using the resist pattern 22 as a mask as indicated in FIG. 3F, wherein it should be noted that the electrode pattern 20A carries thereon a low resistance pattern 21A in conformity with the electrode pattern 20A. It should be noted that the electrode pattern 20A thus formed has a mushroom shape in which the lateral size of the electrode pattern 20A increases gradually from the bottom part to the top part thereof, in conformity with the shape of the foregoing opening 19A. The patterning of the low resistance pattern 21A is typically conducted by an ion milling process of the layer 21. Further, the patterning of the electrode pattern 20A may be conducted by an RIE (Reactive Ion Etching) process while using a mixture of a fluorine compound gas and oxygen as an etching gas.

Figure 3G:
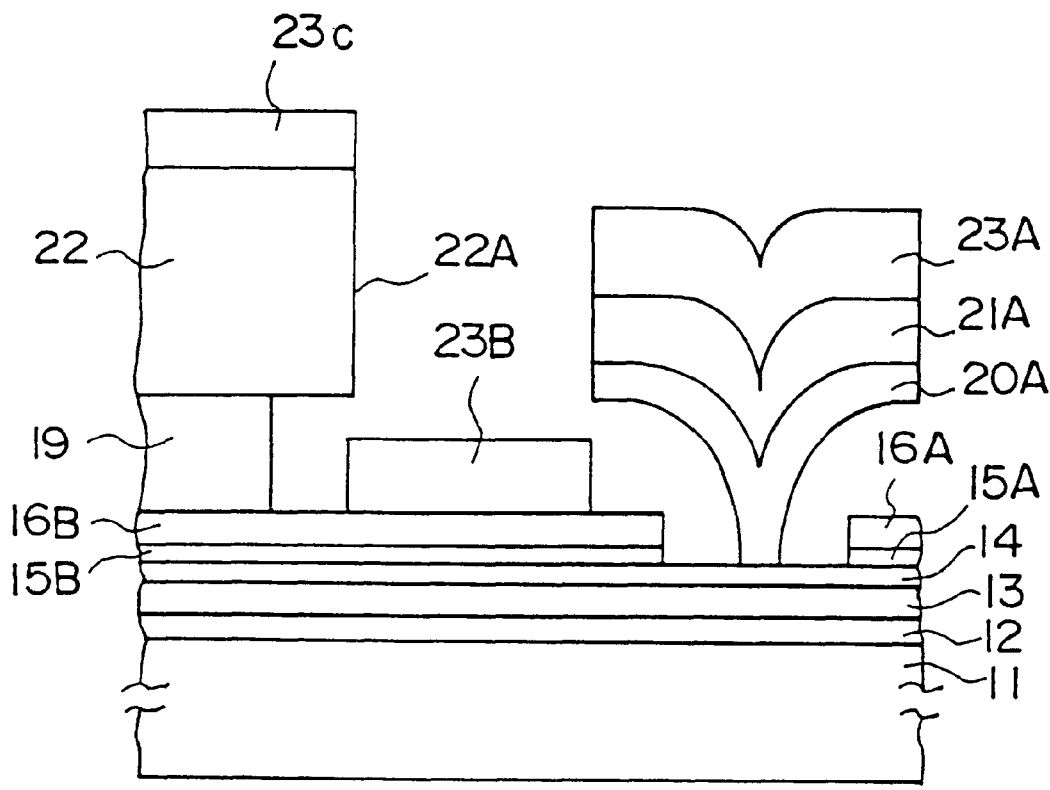

Next, in the step of FIG. 3G, a resist film 22 is formed on the insulation film 19, and an opening 22A is formed in the resist film 22 such that the opening 22A exposes an active region of the HEMT 10 to be formed, including the source region, the drain region and the gate region. In FIG. 3G, the source region is not illustrated for the sake of simplicity of the drawing. As the opening 22A is a large opening, no problem of resolution limit occurs in the photolithographic process even when the HEMT to be formed is extremely miniaturized.

After the formation of the opening 22A, the insulation film 19 is subjected to a wet etching process through the opening 22A while using a buffered HF solution as an etchant. For example, a solution in which HF and $NH_4F$ are mixed with a ratio of 1:10 is used, wherein an etching rate of about 220 nm/min is obtained for the $SiO_2$ film 19 when the etchant of the foregoing composition is used. In the wet etching process of the $SiO_2$ film 19 noted above, it should be noted that no substantial etching or erosion occurs in the electrode pattern 20A that is formed of TiW, TiN or TiWN. Further, the exposed electron supplying layer 14 of InGaP is immune to the etching during the foregoing wet etching of the $SiO_2$ film 19.

In the step of FIG. 3G, it should be noted that an ohmic electrode 23B is formed on the cap layer 16B by a self-aligned process using the gate electrode pattern 20A as a mask, wherein the ohmic electrode 23B thus formed has a stacked structure of AuGe/Ni/Au. The ohmic electrode 23B acts as a drain electrode of the HEMT 10. Further, a similar ohmic electrode not illustrated is formed on the cap layer 16A as a source electrode of the HEMT 10.

Figure 3H:
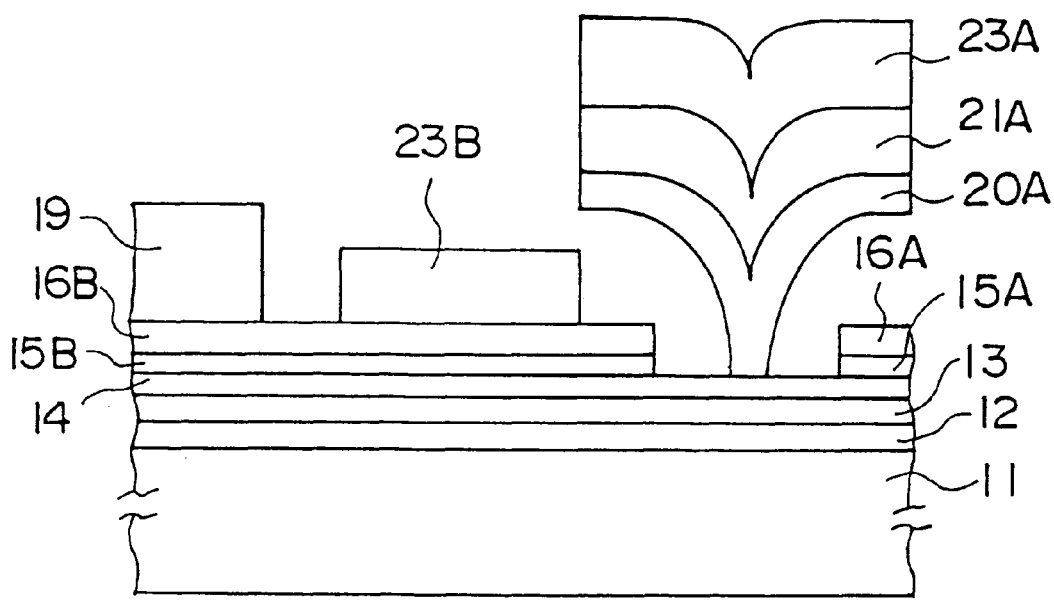

Further, the resist film 22 is lifted off in the step of FIG. 3H and the fabrication of the desired HEMT 10 is completed.

As noted already, the HEMT 10 thus formed is immune to the problem of the erosion of the gate electrode 20A or the electron supplying layer 14 during the removal of the insulation film 19. Thus, the present embodiment enables a fabrication of a high-speed, miniaturized HEMT having a reduced gate length and simultaneously a reduced parasitic capacitance, with reliability and reproducibility.

In the present embodiment, it should be noted that the insulation film 19 (and hence the insulation film 17) is by no means limited to $SiO_2$ but the use of SiON or SiN is also possible.

In the event SiON is used for the insulation film 19 or film 17, it is possible to use the same buffered HF solution for the etchant. In this case, an etching rate of about 100 nm/min is obtained.

When SiN is used for the insulation film 19 or 17, on the other hand, a mixture of pyrophosphoric acid or a buffered HF solution can be used as an etchant, wherein the buffered HF solution in this case may be formed by mixing HF and $NH_4F$ with a ratio of 1:5. In the latter case, the etching rate becomes about 30 nm/min.

Second Embodiment

It should be noted that the foregoing process of the present invention is not only effective in the fabrication of a HEMT but is also effective in, the fabrication of other FETs that has a gate electrode such as a MESFET.

Figure 4:
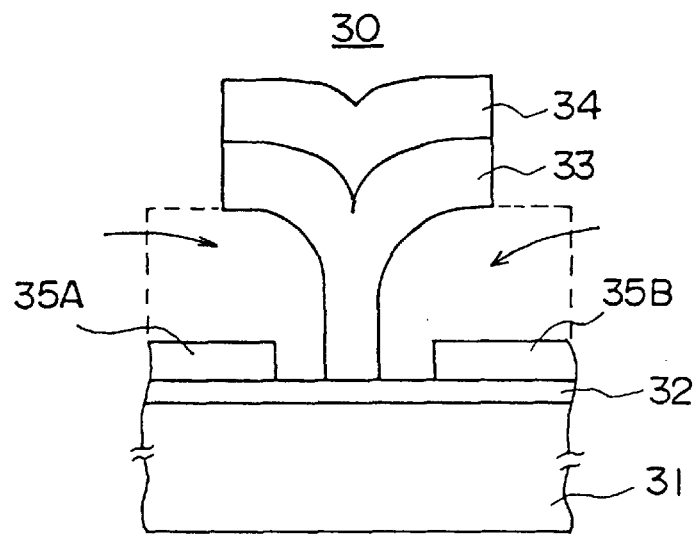
FIG. 4 is a diagram showing a fabrication process of a MESFET according to a second embodiment of the present invention.

FIG. 4 shows the process of the present invention as applied to the fabrication of a MESFET 30.

Referring to FIG. 4, the MESFET 30 is constructed on a semi-insulating GaAs substrate 31 and includes a channel layer 32 of n-type InGaP formed on the substrate 31.

The channel layer 32 carries thereon a gate electrode 33 of the mushroom type formed of a refractory metal compound such as TiW, TiN or TiWN in correspondence to the gate region, wherein the gate electrode 33 carries thereon a low resistance layer 34 of a Ti/Au structure as usual.

Further, ohmic electrodes 35A and 35B are formed at both sides of the gate electrode 33 respectively as a source electrode and a drain electrode.

When forming the MESFET 30 of FIG. 4, it is necessary to remove the insulation film (shown by a broken line in FIG. 4) between the channel layer 32 and the gate electrode 33 by a wet etching process as indicated by an arrow. In the present embodiment, too, the channel layer 32, formed of InGaP, shows an excellent resistance against the wet etching process. Further, the gate electrode 33, formed of a refractory metal compound, shows an excellent resistance against the wet etching process. Thereby, the problem of the channel layer 32 or the gate electrode 33 experiences an etching during the wet etching process of the insulation film is successfully avoided.

Third Embodiment

It should be noted that the present invention is not only effective in the fabrication of FETs as note above but is also effective in the fabrication of bipolar transistors such as an HBT.

Figure 5:
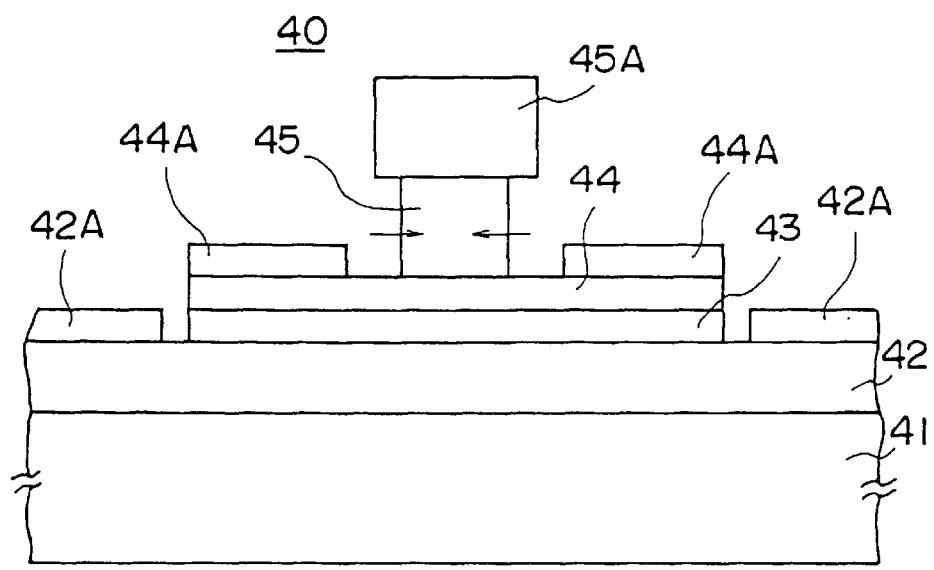
FIG. 5 is a diagram showing a fabrication process of an HBT according to a third embodiment of the present invention.

FIG. 5 shows the construction of an HBT 40 according to a third embodiment of the present invention.

Referring to FIG. 5, the HBT 40 is constructed on a semi-insulating GaAs substrate 41 on which a collector contact layer 42 of n-type GaAs and a collector layer 43 of an undoped or n-type GaAs are formed consecutively and epitaxially. On the collector layer 43, a base layer 44 of p-type InGaP is formed epitaxially, and an emitter layer 45 of n-type AlGaAs is formed on the base layer 44 epitaxially. Further, a cap layer of n-type GaAs not shown in FIG. 5 is provided on the emitter layer 45.

The layered semiconductor body including the layers 42–45 as such are subjected to a mesa etching process such that the collector contact layer 42 is exposed, wherein an ohmic electrode 42A having an AuGe/Au stacked structure is provided on the exposed surface of the collector contact layer 42 as a collector electrode. Further, the emitter layer 45 is subjected to another mesa etching process that exposes the base layer 44, wherein an ohmic electrode 44A having a Pd/Zn/Pt/Au stacked structure is provided on the exposed surface of the base electrode 44 as a base electrode. Further, an emitter electrode 45A formed of a refractory metal compound such as TiW, TiN or TiWN is provided on the emitter region 45 thus formed.

In the fabrication of the HBT 40 of FIG. 5, it should be noted that an emitter region 45 is subjected to a wet etching process as indicated by arrows by using a buffered HF solution prior to the formation of the ohmic electrode 42A or 44A, such that the base-emitter capacitance is minimized. In the present invention, the problem of etching of the base layer 44 during such a wet etching process is successfully eliminated as a result of the use of InGaP, a III-V compound that contains P as the group V element, for the base layer 44. It should be noted that the base layer 44 is generally formed to have an extremely small thickness for maximizing the operational speed of the HBT, wherein the HBT 40 of the present embodiment is advantageous for reproducing such an optimum structure with reliability. Further, it should be noted that the emitter electrode 45A, which is formed of the refractory metal compound noted before and used as an etching mask during the wet etching process of the emitter layer 45, is substantially immune to the etching during the wet etching process.

Fourth Embodiment

Figure 6:
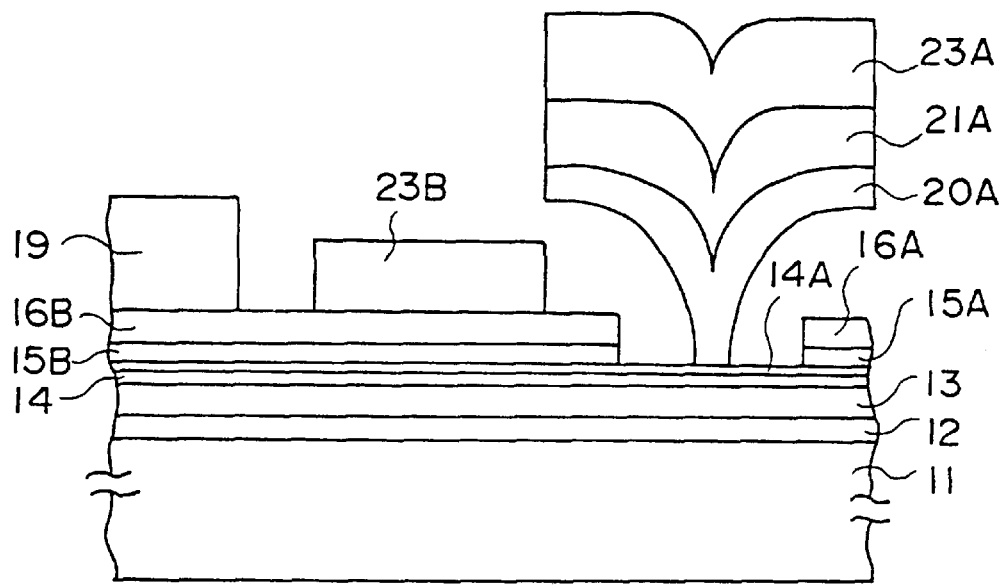
FIG. 6 is a diagram showing the construction of a HEMT according to a fourth embodiment of the present invention.

FIG. 6 shows the construction of a HEMT 50 according to a fourth embodiment of the present invention, wherein those parts corresponding to the parts described previously are designated by the same reference numerals and the description thereof will be omitted.

Referring to FIG. 6, the present embodiment uses n-type AlGaAs for the electron supplying layer 14 as is practiced in the art, except that a thin layer 14A of n-type InGaP is formed on the electron supplying layer 14 as a part thereof, wherein the layer 14A may be formed to have a thickness of typically 5 nm.

The InGaP layer 14A thus formed acts as an effective etching stopper during the etching step of the insulation film 19 shown in FIG. 3G and prevents the erosion of the electron supplying layer 14 even in the case the electron supplying layer 14 is formed of AlGaAs.

Fifth Embodiment

Figure 7:
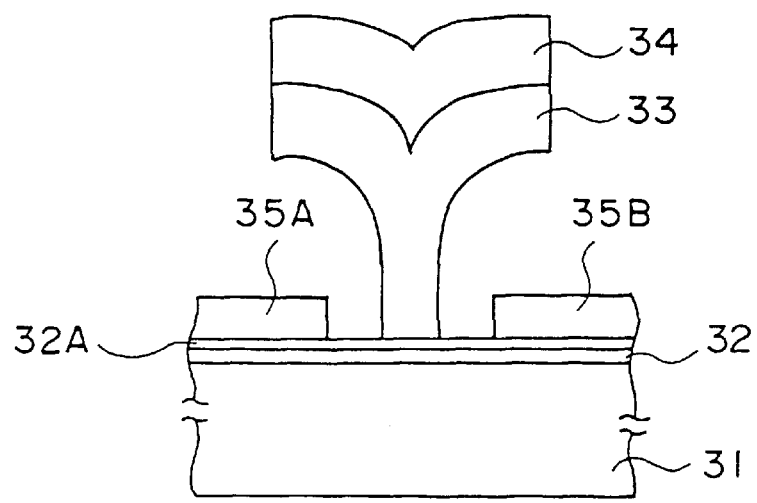
FIG. 7 is a diagram showing the construction of a MESFET according to a fifth embodiment of the present invention.
Figure 8:
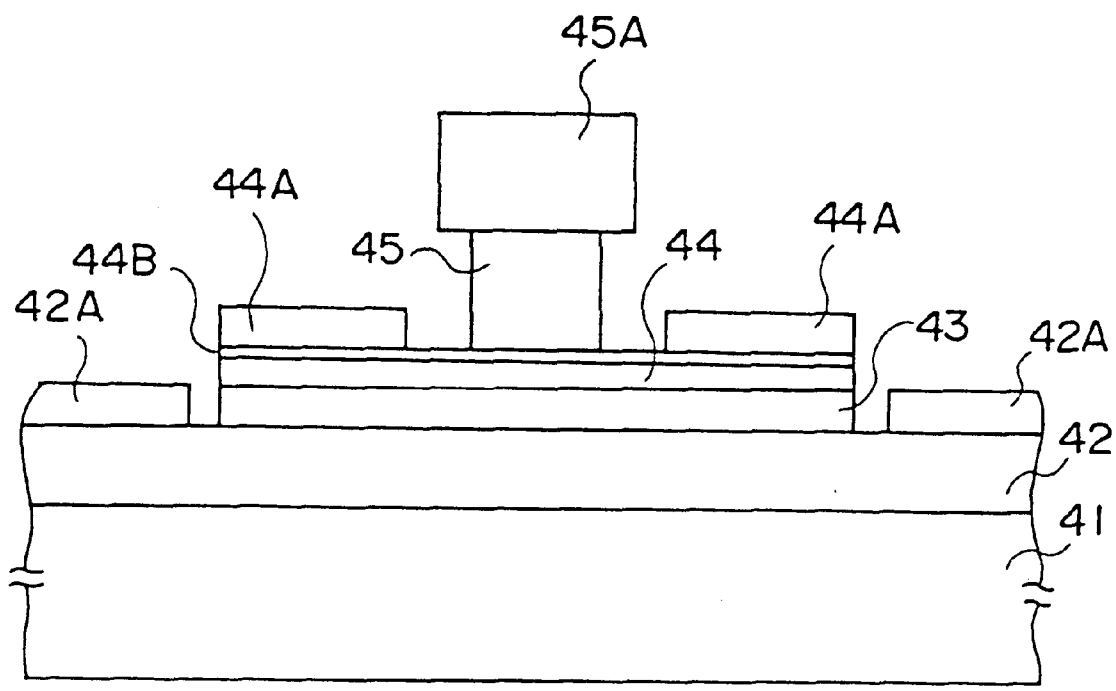
FIG. 8 is a diagram showing the construction of an HBT according to the fifth embodiment of the present invention.

It should be noted that a similar etching stopper layer may be provided also in the MESFET 30 of FIG. 7 or HBT 40 of FIG. 8. In the case of the MESFET 30 of FIG. 7, an etching stopper layer 32A of n-type InGaP is provided on the channel layer 32 of n-type GaAs with a thickness of about 5 nm. In the HBT 40 of FIG. 8, on the other hand, an etching stopper layer 44B of n-type InGaP is provided on the base layer 44 of commonly used p-type GaAs with a thickness of typically 5 nm.

The etching stopper layer of InGaP thus formed does not cause any problem in the operation of the semiconductor device as long as the thickness thereof is below several nanometers.

As other features of the embodiment of FIGS. 7 and 8 are obvious from the previous description, further description thereof will be omitted.

Further, the present invention is by no means limited to the embodiments described heretofore, but various variations and modifications may be made without departing from the scope of the present invention.

What is claimed is:

1. A method of fabricating a semiconductor device, comprising the steps of:

forming an insulation film on a compound semiconductor layer;

forming an opening in said insulation film so as to expose a part of said compound semiconductor layer;

forming a gate electrode of a refractory metal compound on said insulation film such that said gate electrode contacts with said compound semiconductor layer at said contact hole; and removing said insulation film by a wet etching process;

said wet etching process being conducted by an etchant to which both of said gate electrode and said compound semiconductor layer show a resistance;

wherein said compound semiconductor layer comprises a group III–V compound semiconductor material that contains P as a group V element, said insulation film is selected from $SiO_2$ and SiON, said gate electrode is selected from a group consisting of WN, TiW and TiWN, and wherein said etchant is a buffered HF solution, and wherein said step of forming said opening is conducted such that a lateral size of said opening increases continuously from a bottom surface to a top surface of said insulation film.

2. A method as claimed in claim 1, wherein said compound semiconductor layer is formed of InGaP.

3. A method as claimed in claim 1, wherein said gate electrode is formned of TiW.

4. A method as claimed in claim 1, wherein said insulation film is formed of SiN, and wherein a pyrophosphoric solution is used for said etchant.

5. A method as claimed in claim 1, wherein said semiconductor device is a HEMT and wherein said compound semiconductor layer forms an electron supplying layer of said HEMT.

6. A method as claimed in claim 1, wherein said semiconductor device is a HEMT and wherein said compound semiconductor layer is a layer provided on an electron supplying layer of said HEMT, said compound semiconductor layer having a composition different from a composition of said electron supplying layer.

7. A method as claimed in claim 1, wherein said semiconductor device is a MESFET, and wherein said compound semiconductor layer is a channel layer of said MESFET.

8. A method as claimed in claim 1, wherein said semiconductor device is a MESFET, and wherein said compound semiconductor layer is a layer provided on said channel layer of said MESFET, said compound semiconductor layer having a composition different from a composition of said channel layer.

* * * * *